(12) United States Patent
Nozaki (10) Patent No.: US 9,404,958 B2
(45) Date of Patent: Aug. 2, 2016

(54) DIELECTRIC STRENGTH VOLTAGE TESTING METHOD FOR ELECTRONICS DEVICE

(71) Applicant: CANON KABUSHIKI KAISHA, Tokyo (JP)

(72) Inventor: Tetsuya Nozaki, Kashiwa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 364 days.

(21) Appl. No.: 13/766,241

(22) Filed: Feb. 13, 2013

(65) Prior Publication Data

US 2013/0257451 A1 Oct. 3, 2013

(30) Foreign Application Priority Data

Mar. 27, 2012 (JP) ................. 2012-072341

(51) Int. Cl.
*G01R 31/18* (2006.01)
*G01R 31/02* (2006.01)
*G06F 1/26* (2006.01)
*G01R 31/12* (2006.01)

(52) U.S. Cl.
CPC .............. *G01R 31/18* (2013.01); *G01R 31/028* (2013.01); *G06F 1/26* (2013.01); *G01R 31/129* (2013.01)

(58) Field of Classification Search
CPC .. G01R 31/025; G01R 31/1272; G01R 31/12; G01R 31/1223; G01R 31/18; G01R 31/028; G01R 31/129; G01R 27/025; G06F 1/26; G03G 15/5003; G03G 15/2078; G03G 15/80; G03G 15/55; Y02B 60/1267
USPC ........................................................ 324/551
See application file for complete search history.

(56) References Cited

U.S. PATENT DOCUMENTS

2007/0247770 A1* 10/2007 Ishikawa et al. ................ 361/47
2012/0154972 A1* 6/2012 McMahon ............. H01H 47/22
361/187
2013/0129367 A1* 5/2013 Jeong et al. ...................... 399/37

FOREIGN PATENT DOCUMENTS

| JP | H06-245382 A | 9/1994 |
| JP | 2008-164825 | 7/2008 |
| JP | 2008164825 A * | 7/2008 |
| JP | 2008203880 A * | 9/2008 |
| JP | 2011234454 A * | 11/2011 |

OTHER PUBLICATIONS

Sano et al JP2008-164825 (English Machine Translation) Published Jul. 17, 2008.*
Aoki et al JP2011-234454 (English Machine Translation) Published Nov. 17, 2011.*

(Continued)

*Primary Examiner* — Melissa Koval
*Assistant Examiner* — Felicia Farrow
(74) *Attorney, Agent, or Firm* — Fitzpatrick, Cella, Harper & Scinto (57) ABSTRACT

A first X capacitor is connected between one of a plurality of hot line sections of a hot line that is located at an output side of a first relay as viewed from a commercial alternating-current power supply, and one of a plurality of neutral line sections of a neutral line that is located at an input side of a second relay as viewed from the commercial alternating-current power supply. A second X capacitor is connected between one of the hot line sections that is located at the output side of the first relay as viewed from the commercial alternating-current power supply, and one of the neutral line sections that is located at an output side of the second relay as viewed from the commercial alternating-current power supply.

12 Claims, 9 Drawing Sheets

(56) References Cited

OTHER PUBLICATIONS

Maekawa JP2008-203880 (English Machine Translation) Published Sep. 4, 2008.*

U.S. Appl. No. 13/891,658, filed May 10, 2013, by Manabu Kosdeki et al.

Japanese Office Action dated Feb. 22, 2016 in Japanese Application No. 2012-072341.

* cited by examiner

PRIOR ART

DIELECTRIC STRENGTH VOLTAGE TESTING METHOD FOR ELECTRONICS DEVICE

BACKGROUND OF THE INVENTION

1. Field of the Invention

The present invention relates to methods for performing a dielectric strength voltage test on an electronics device.

2. Description of the Related Art

To allow or block supply of power from a commercial alternating-current power supply to an image formation device, a switch may be inserted between a hot line and a neutral line. On the other hand, there are an increasing number of image formation devices including a hard disk drive (HDD) or the like. If the user suddenly turns off the above switch to block all power supply, a HDD failure (head crash) may occur. Therefore, there is a demand for a technique of, even when the power supply switch is turned off, continuing to supply power to units associated with the HDD until the HDD is safely stopped.

Japanese Patent Laid-Open No. 2008-164825 proposes that a relay is used to switch on and off a power supply line from a commercial alternating-current power supply. As a result, a controller performs a shutdown process before the relay interrupts the power supply line.

Incidentally, power supply lines are required by safety standards of each country to have a predetermined dielectric strength voltage. Therefore, electronics devices such as image formation devices and the like are required to comply with the standards. Therefore, electronics devices are designed during the design process to reach the standards, taking into consideration the insulating distance, the dielectric strength voltage of the insulating material, and the like. Moreover, a dielectric strength voltage test is performed in the manufacturing process.

However, in the circuit configuration of Japanese Patent Laid-Open No. 2008-164825, the relay is turned on and off by the controller, and therefore, in order to control the relay, it is essential that the controller is operating. Therefore, if appropriate measures are not taken, the dielectric strength voltage test cannot be performed in the mass production step at a factory. In other words, unless the relay has been actuated by any means, an alternating-current voltage for the dielectric strength voltage test cannot be applied to the device.

SUMMARY OF THE INVENTION

The present invention provides an electronics device in which a switch element that requires supply of a control signal to operate is provided on a power supply line, and on which a dielectric strength voltage test can be performed in the absence of supply of the control signal to the switch element.

According to the embodiment, an electronics device comprising the following elements is provided. A first switch element is configured to switch on and off a hot line connected to a commercial alternating-current power supply. A second switch element is configured to switch on and off a neutral line connected to the commercial alternating-current power supply. A first electric element is connected between one of a plurality of hot line sections of the hot line and one of a plurality of neutral line sections of the neutral line. The one of the plurality of hot line sections is located at an output side of the first switch element as viewed from the commercial alternating-current power supply. The one of the plurality of neutral line sections being located at an input side of the second switch element as viewed from the commercial alternating-current power supply. The first electric element is configured to apply an alternating current for a dielectric strength voltage test from the neutral line section located at the input side of the second switch element to the hot line section located at the output side of the first switch element. A second electric element is connected between one of the plurality of hot line sections located at the output side of the first switch element as viewed from the commercial alternating-current power supply, and one of the plurality of neutral line sections located at an output side of the second switch element as viewed from the commercial alternating-current power supply. The second electric element is configured to apply the alternating current for the dielectric strength voltage test from the hot line section located at the output side of the first switch element to the neutral line section located at the output side of the second switch element.

Further features of the present invention will become apparent from the following description of exemplary embodiments (with reference to the attached drawings).

DESCRIPTION OF THE EMBODIMENTS

Related Art

Figure 1:
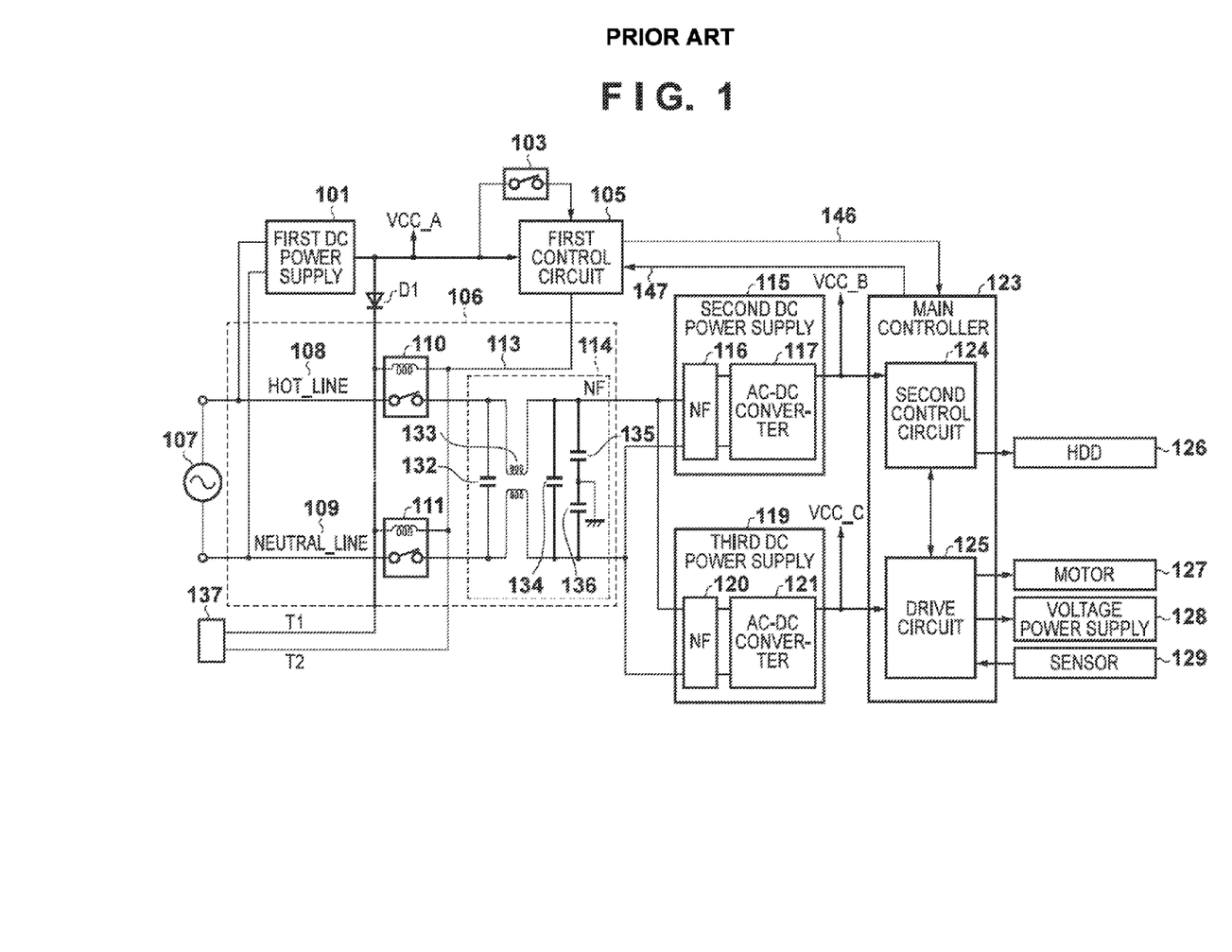
FIG. 1 is a block diagram showing an electronics device according to a comparative example.
Figure 2:
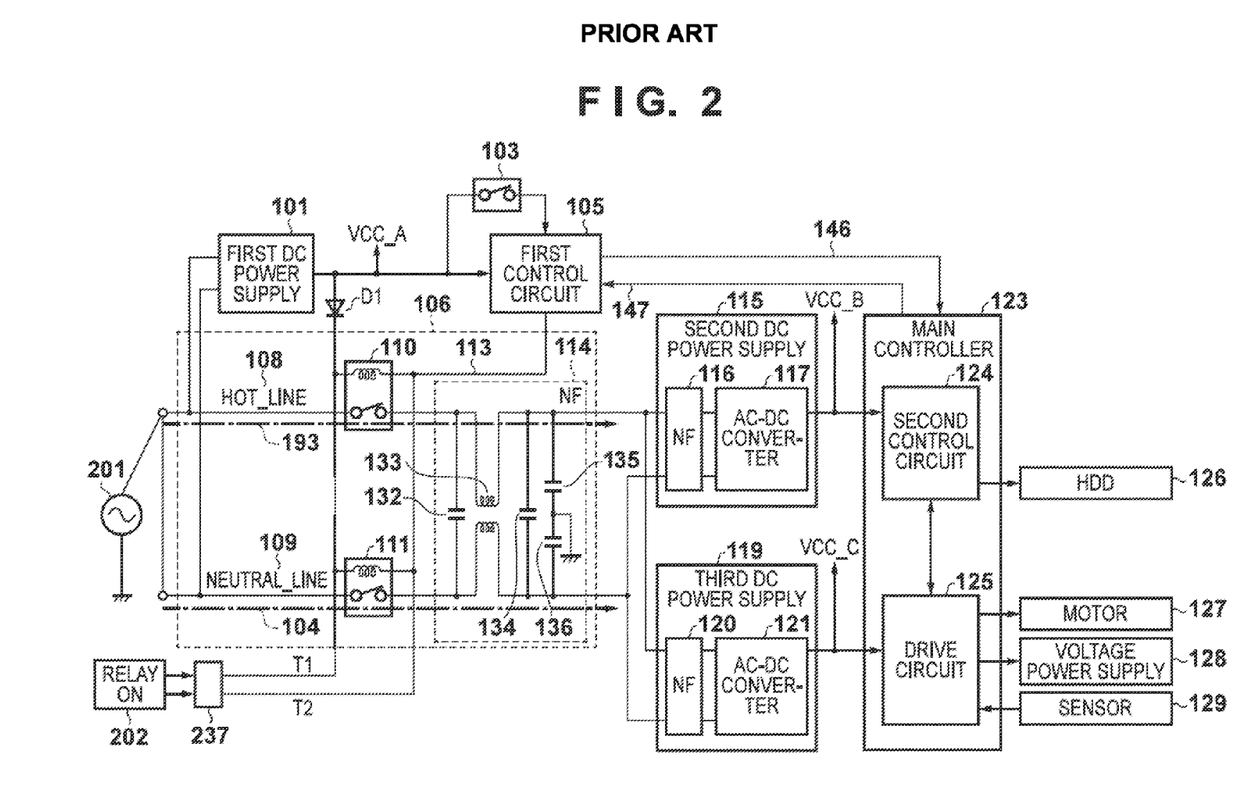
FIG. 2 is a diagram showing a dielectric strength voltage test in the comparative example.

An example dielectric strength voltage testing method will be described with reference to FIGS. 1 and 2. In FIG. 1, a commercial alternating-current power supply 107 is connected via an electrical plug or the like to a hot line 108 and a neutral line 109. The hot line 108 and the neutral line 109 are connected to a first direct-current power supply 101 and an alternating-current input unit 106.

The first direct-current power supply 101 converts an alternating current from the commercial alternating-current power supply 107 into a direct current to output a direct-current voltage VCC_A. The direct-current voltage VCC_A is applied via a main power supply switch 103 to a first control circuit 105 and a diode D1. The first direct-current power supply 101 and the first control circuit 105 operate with a power of, for example, as low as 1 W or less. The first control circuit 105 monitors the on/off state of the main power supply switch 103. When detecting the on state of the main power supply switch 103, the first control circuit 105 outputs a relay drive signal 113 (high level) to a first relay 110 and a second relay 111. As a result, the first and second relays 110 and 111 are switched on. On the other hand, when detecting the off state of the main power supply switch 103, the first control circuit 105 outputs the relay drive signal 113 (low level) to the first and second relays 110 and 111. As a result, the first and second relays 110 and 111 are switched off.

The alternating-current input unit 106 includes the first relay 110 that switches on and off the hot line 108, the second relay 111 that switches on and off the neutral line 109, and a noise filter 114 that filters line noise from the commercial alternating-current power supply. The noise filter 114 includes a first X capacitor 132, a common-mode inductor 133, a second X capacitor 134, and Y capacitors 135 and 136.

At an output side of the noise filter 114, a second direct-current power supply unit 115 and a third direct-current power supply unit 119 are connected to the hot line 108 and the neutral line 109. The second direct-current power supply unit 115 includes a noise filter 116 and an AC-DC converter 117. The second direct-current power supply unit 115 converts an alternating current supplied from the commercial alternating-current power supply 107 into a direct current to generate a direct-current voltage VCC_B. The direct-current voltage VCC_B is mainly used to operate a logic circuit. The direct-current voltage VCC_B is applied to a second control circuit 124 of a main controller 123. The second control circuit 124 controls, for example, the shutdown of a hard disk drive device (HDD 126). The third direct-current power supply unit 119 includes a noise filter 120 and an AC-DC converter 121. The AC-DC converters 117 and 121 have a function of converting an input AC voltage into a DC voltage. The third direct-current power supply unit 119 converts an alternating current supplied from the commercial alternating-current power supply 107 into a direct current to generate a direct-current voltage VCC_C. The direct-current voltage VCC_C is used to drive a load. Specifically, the direct-current voltage VCC_C is applied to a drive circuit 125 of the main controller 123. The drive circuit 125 drives a motor 127, a high voltage power supply 128, a sensor 129 and the like in accordance with commands from the second control circuit 124.

With such a circuit configuration, safe shutdown can be achieved. For example, when the user switches off the main power supply switch 103, the first control circuit 105 detects the off state of the main power supply switch 103, and outputs a shutdown request signal 146 to the second control circuit 124. The second control circuit 124 performs a shutdown process including a retraction process for the HDD 126 or the like in accordance with the shutdown request signal 146. After the shutdown process has been completed, the second control circuit 124 outputs a shutdown completion signal 147 to the first control circuit 105. The first control circuit 105, when receiving the shutdown completion signal 147, outputs the relay drive signal 113 for switching off the first and second relays 110 and 111.

A connecter 137 is used to connect a signal generation circuit used in a dielectric strength voltage test that is a part of a manufacturing process at a factory. A relay drive signal T1 (Power) and a relay drive signal T2 (GND) are applied via the connecter 137 to control terminals (electromagnetic induction coils) of the first and second relays 110 and 111, respectively. As a result, the first and second relays 110 and 111 are switched on, so that the dielectric strength voltage test can be performed.

The dielectric strength voltage testing method will be described in greater detail with reference to FIG. 2. When the dielectric strength voltage test is performed, a test power supply 201 is connected between the hot line 108 and the neutral line 109, and the ground, to apply an alternating current for the dielectric strength voltage test. Incidentally, when power is not supplied from the commercial alternating-current power supply 107, the first and second relays 110 and 111 interrupt the hot line 108 and the neutral line 109. This is because the first control circuit 105 is not operating, and the relay drive signal 113 is not being applied to the first and second relays 110 and 111. In order to test the hot line 108 and the neutral line 109 located at an output side of the noise filter 114 as viewed from the first and second relays 110 and 111, it is necessary to switch on the first and second relays 110 and 111. By switching on the first and second relays 110 and 111, an alternating current for the dielectric strength voltage test can be applied to the hot line 108 and the neutral line 109 in paths indicated by dash-dot lines 193 and 104 with a dash doted arrow line in FIG. 2.

A relay-on tool 202 connected to the connecter 137 is a signal generation circuit that is used in the dielectric strength voltage test that is a part of the manufacturing process at a factory. The relay-on tool 202 generates and applies the relay drive signal T1 (Power) and the relay drive signal T2 (GND) to the control terminals (electromagnetic induction coils) of the first and second relays 110 and 111, respectively. As a result, the first and second relays 110 and 111 are switched on, so that the dielectric strength voltage test can be performed.

A line for applying the relay drive signal T1 (Power) is connected to VCC_A. Therefore, the diode D1 is connected to the line so that the relay drive signal T1 (Power) is not applied to VCC_A.

In this related art (FIGS. 1 and 2), a dielectric strength voltage test can be performed in a manufacturing process at a factory. Note that the relay-on tool 202 that generates a drive signal for forcing the first and second relays 110 and 111 to be switched on, the diode D1 and the like are additionally required.

Examples

Figure 3:
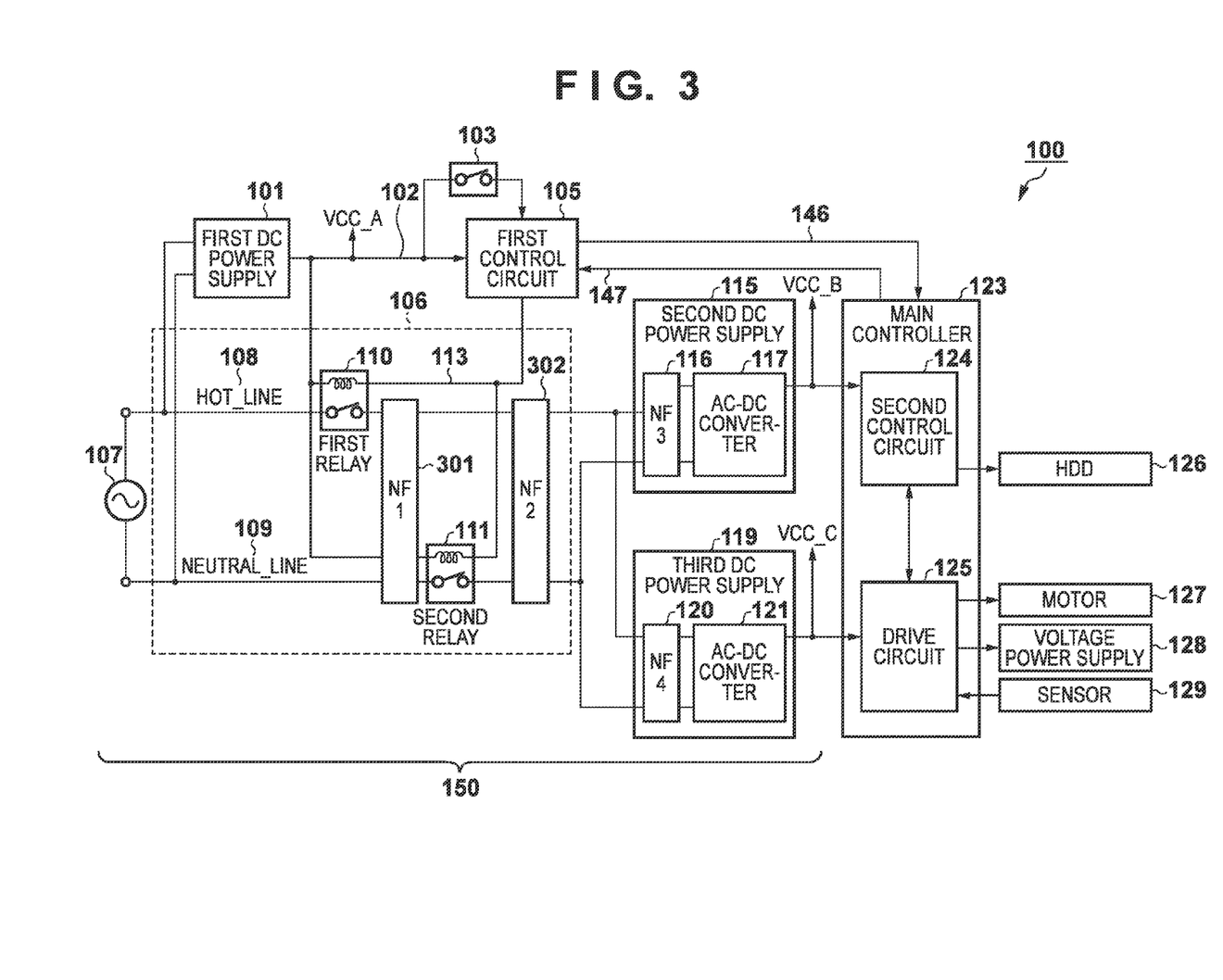
FIG. 3 is a block diagram showing an electronics device according to an example.

FIG. 3 is a block diagram of an electronics device of this example. Note that parts that have already been described are indicated by the same reference characters for the sake of simplicity of description. Here, it is assumed that the electronics device is an image formation device 100, or may, of course, be other electronics devices. In FIG. 3, a power supply device 150 includes a plurality of AC-DC converters. Of course, the power supply device 150 may include a plurality of AC-DC converters and a plurality of DC-DC converters or may include a single AC-DC converter and a plurality of DC-DC converters. An electronics device such as the image formation device 100 may require a plurality of voltage sources of DC 24 V, DC 12 V, DC 5 V, DC 3.3 V and AC 100 V, or the like, and therefore, may require a plurality of voltage converters. If there are a normal power mode (image formation mode) and a power-saving mode (standby mode) in which power consumption is lower than in the normal power mode, the voltage converters need to be controlled so that the voltage converters are individually turned on and off. Even in such a case, it is advantageous to employ a plurality of voltage converters.

In FIG. 3, it is a characteristic feature that the above noise filter 114 is divided into a first noise filter 301 and a second noise filter 302, and the second relay 111 is provided at a different location.

Note that the hot line 108 includes a plurality of hot line sections, and the neutral line 109 also includes a plurality of neutral line sections. Note that each section is a line segment between elements or a line segment from one connection point to another connection point.

In Example 1, the first X capacitor 132 is employed as a first electric element that is connected between one of the hot line sections of the hot line 108 that is located at an output side of a first switch element (a first relay 110) as viewed from the commercial alternating-current power supply 107, and one of the neutral line sections of the neutral line 109 that is located at an input side of a second switch element (a second relay 111) as viewed from the commercial alternating-current power supply 107. The first X capacitor 132 is included in the first noise filter 301. The first X capacitor 132 allows an alternating current for a dielectric strength voltage test to be applied from the neutral line section located at the input side of the second relay 111 to the hot line section located at the output side of the first relay 110. Of course, it is not necessary to apply a control signal, such as a relay drive signal or the like, to the first relay 110.

Also, the second X capacitor 134 is employed as a second electric element that is connected between one of the hot line sections of the hot line 108 that is located at an output side of the first relay 110 as viewed from the commercial alternating-current power supply 107, and one of the neutral line sections of the neutral line 109 that is located at an output side of the second relay 111 as viewed from the commercial alternating-current power supply 107. The second X capacitor 134 is included in the second noise filter 302. The second X capacitor 134 allows an alternating current for a dielectric strength voltage test to be applied from the hot line located at the output side of the first relay 110 to the neutral line located at the output side of the second relay 111.

Figure 4:
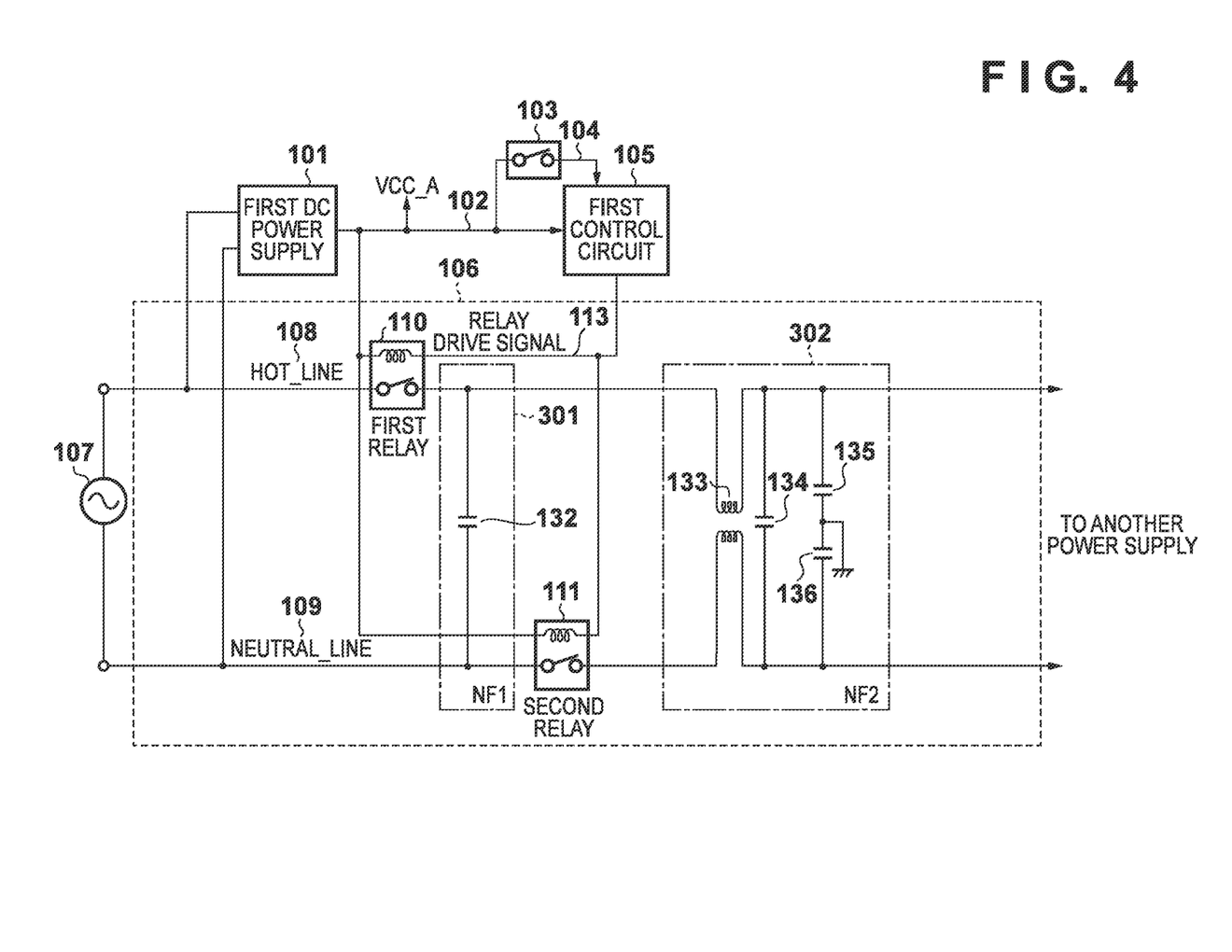
FIG. 4 is a block diagram showing an alternating-current input unit in the example.

FIG. 4 is a diagram showing details of the alternating-current input unit 106 of this example. In FIG. 4, the first noise filter 301 includes the first X capacitor 132. The second noise filter 302 is located at an output side of the first and second relays 110 and 111 as viewed from the commercial alternating-current power supply 107. The second noise filter 302 includes the common-mode inductor 133, the second X capacitor 134, and the Y capacitors 135 and 136. The first and second noise filters 301 and 302 are provided in order to mainly prevent noise occurring from a direct-current power supply or the like in an electronics device from propagating to the commercial alternating-current power supply 107. The first and second X capacitors 132 and 134 are provided in order to mainly remove normal-mode noise occurring between the hot line 108 and the neutral line 109. The Y capacitors 135 and 136 are provided in order to mainly remove common-mode noise occurring between the GND and the power supply lines (the hot line 108 and the neutral line 109). Although, in this example, the first noise filter 301 has the configuration of FIG. 4, the present invention is not limited to this. In order to obtain an advantage of the present invention, it is sufficient that the second X capacitor 134 is provided between the hot line 108 and the neutral line 109 at an output side of the first and second relays 110 and 111 as viewed from the commercial alternating-current power supply 107.

Figure 5:
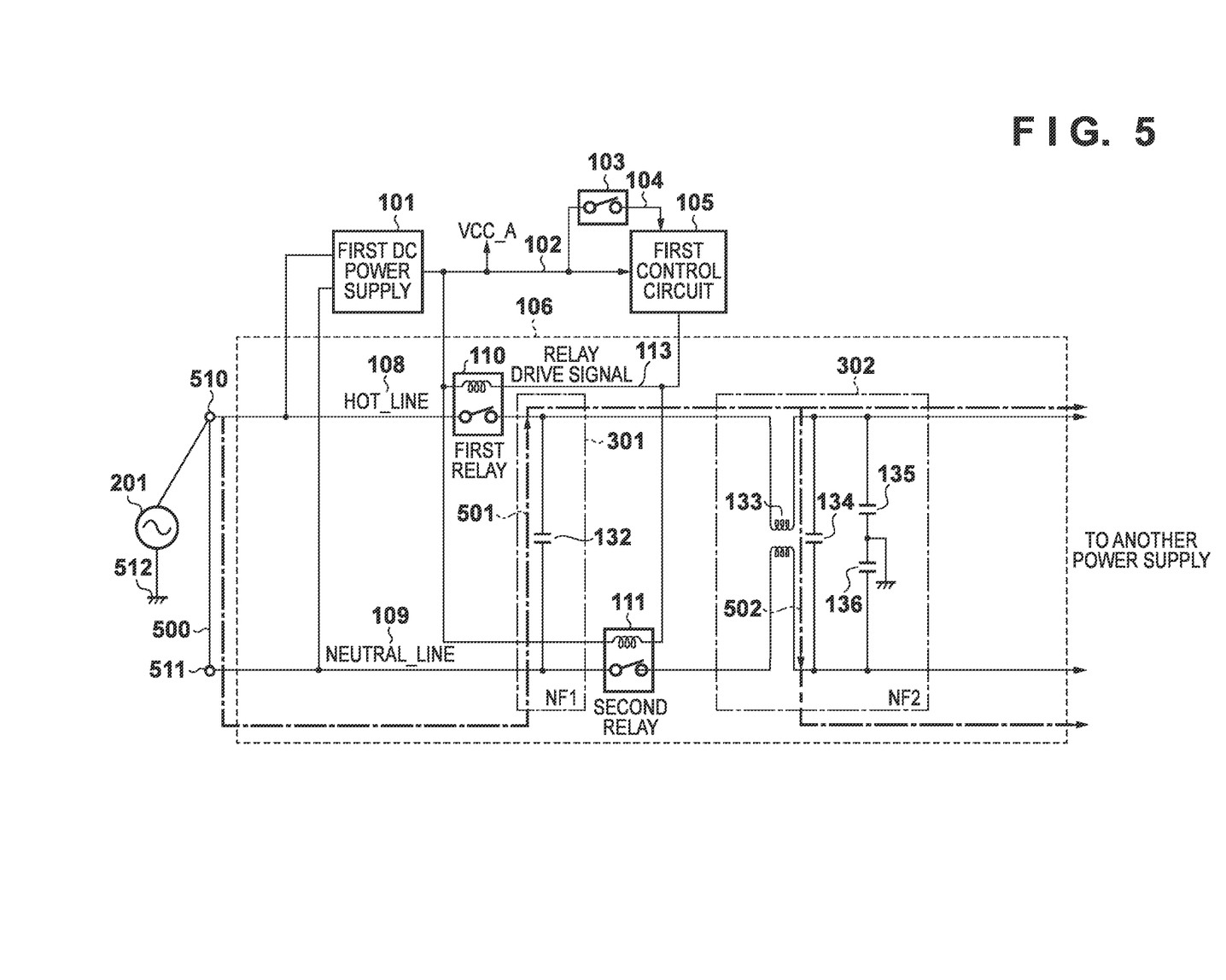
FIG. 5 is a diagram showing a path of an alternating current applied in a dielectric strength voltage test in the example.

Next, an example dielectric strength voltage testing method will be described with reference to FIG. 5. When the dielectric strength voltage test is performed, a shorting line 500 is used to short an input terminal 511 of the hot line 108 and an input terminal 511 of the neutral line 109. Moreover, as shown in FIG. 5, an alternating current for the dielectric strength voltage test that is generated by the test power supply 201 is applied between the input terminal 511 of the hot line 108 and a ground 512. Note that because a short is caused between the input terminal 511 of the hot line 108 and the input terminal 511 of the neutral line 109, power is not supplied to the first direct-current power supply 101. In other words, because of the absence of supply of the relay drive signal 113, the first and second relays 110 and 111 are both off.

In FIG. 5, the alternating current that is applied simultaneously to the hot line 108 and the neutral line 109 by the test power supply 201, is applied through a path 501 indicated by an arrow (via the first X capacitor 132) to the hot line 108 that is located at the output side of the first relay 110 and is interrupted by the first relay 110. On the other hand, the alternating current from the test power supply 201 is applied through a path 502 indicated by an arrow (via the second X capacitor 134) to the neutral line 109 that is located at the output side of the second relay 111 and is interrupted by the second relay 111.

In this example, the alternating current for the dielectric strength voltage test is applied via the first and second X capacitors 132 and 134 to a part to be tested. An influence thereof will be described. Here, as an example, the dielectric strength voltage test was actually performed, where the first X capacitor 132 had a capacitance of 1 µF, and the second X capacitor 134 had a capacitance of 0.47 F. In the dielectric strength voltage test, an alternating-current power supply that can generate an alternating current of 1500 V or more having a frequency of 60 Hz was used. If a current that flows when the alternating current is applied to an electronics device is less than a predetermined threshold, it is decided that the electronics device passes the dielectric strength voltage test.

For example, a resistance value between the power line and the GND that the electronics device requires in order to pass the dielectric strength voltage test can be calculated by:

$$R(\Omega)=V(V)/I(A)=1500/0.001=1500000$$

where the threshold for the current is 1 mA.

Thus, the resistance value is 1.5 MΩ. In other words, the resistance value is required to be 1.5 MΩ or more. The first X capacitor 132 has a capacitance of 1 µF, and therefore, has a resistance value of 2.6 KΩ. The second X capacitor 134 has a capacitance of 0.47 µF, and therefore, has a resistance value of 5.6 KΩ. Therefore, the alternating current for the dielectric strength voltage test is applied via the resistance value to the electronics device.

The calculated resistance value is sufficiently smaller than the resistance value (1.5 MΩ) that is calculated as a value that allows an electronics device to pass the dielectric strength voltage test. Therefore, even if the dielectric strength voltage test is performed via the first and second X capacitors 132 and 134, the dielectric strength voltage test is substantially not affected. Note that the influence of the first X capacitor 132 or the second X capacitor 134 may not be ignored, depending on the resistance value thereof. In such a case, the influence can be cancelled by increasing the alternating current for the dielectric strength voltage test by a value corresponding to the influence or by changing the threshold for the current.

As described above, in this example, the arrangement of the first relay 110, the second relay 111, the first noise filter 301 and the second noise filter 302 is devised. As a result, the dielectric strength voltage test can be perform without any additional wiring or tool for turning on the first and second relays 110 and 111. Note that any other circuit arrangement that can perform the dielectric strength voltage test without any additional wiring or tool for turning on the first and second relays 110 and 111 may be employed instead of the circuit arrangements of FIGS. 4 and 5.

Figure 6:
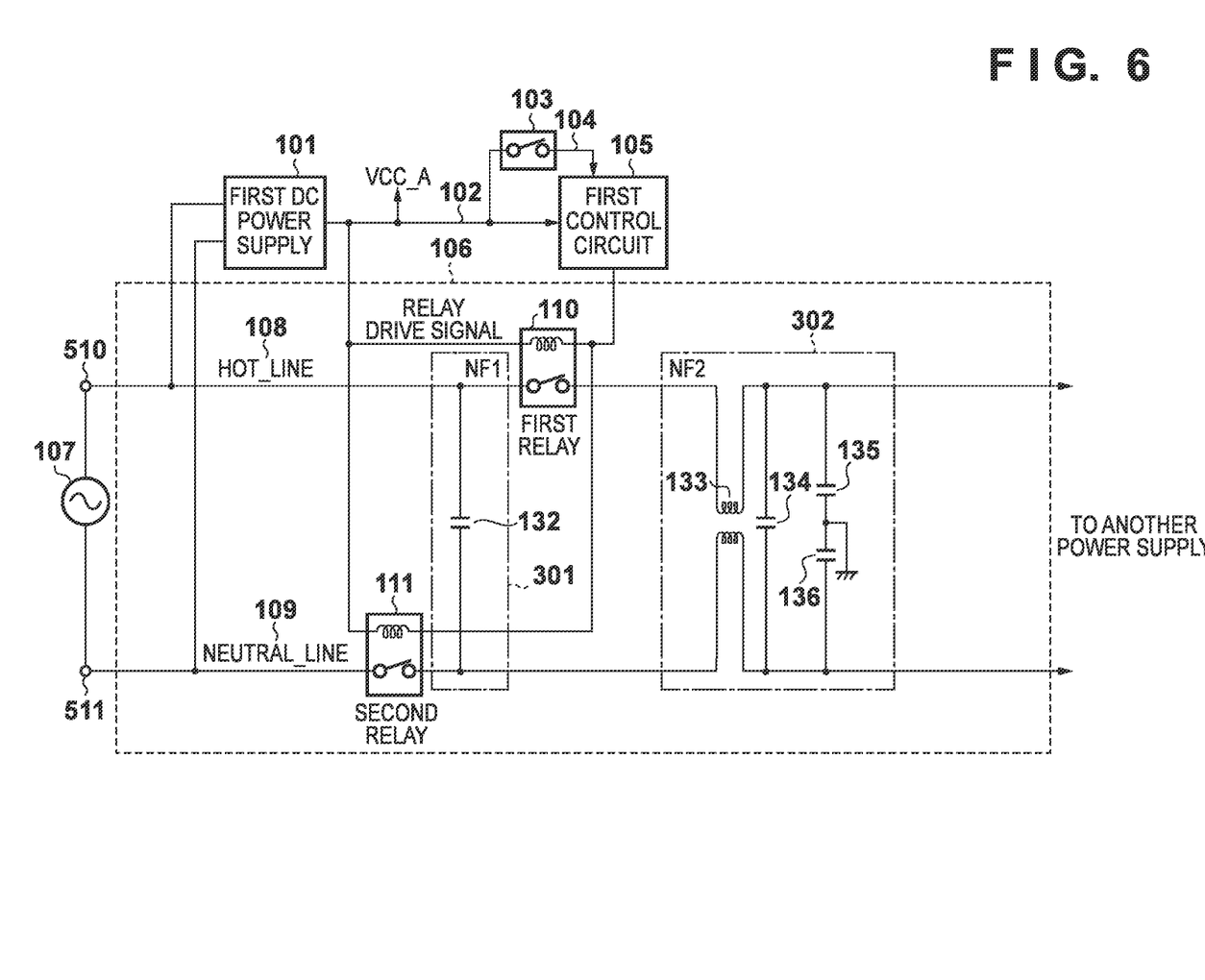
FIG. 6 is a block diagram showing an alternating-current input unit in the example.

FIG. 6 is a diagram showing a variation of Example 1. In FIG. 6, the first X capacitor 132 is connected between one of the hot line sections of the hot line 108 that is located at the input side of the first relay 110 as viewed from the commercial alternating-current power supply 107, and one of the neutral line sections of the neutral line 109 that is located at the output side of the second relay 111 as viewed from the commercial alternating-current power supply 107.

Figure 7:
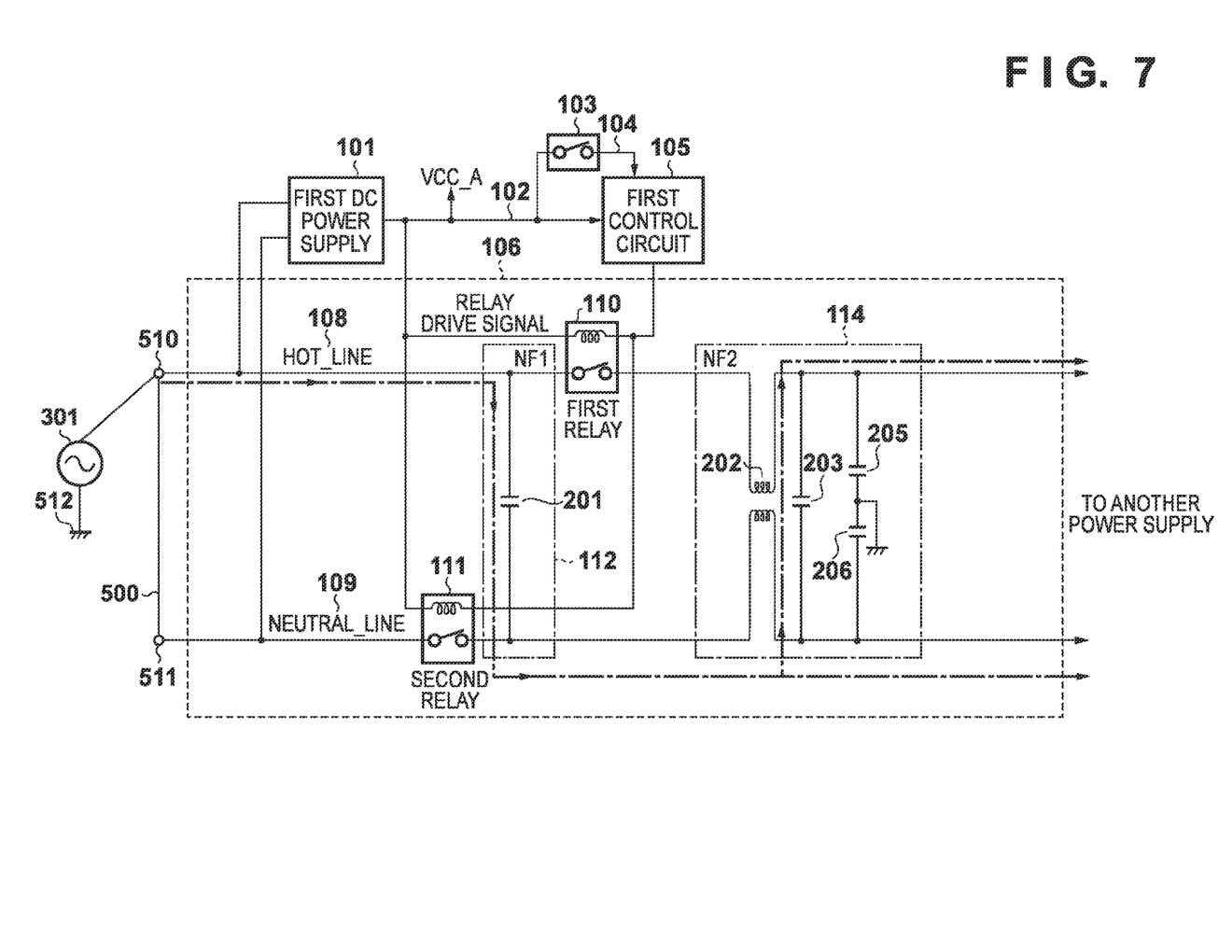
FIG. 7 is a diagram showing a path of an alternating current applied in a dielectric strength voltage test in the example.

As shown in FIG. 7, the first X capacitor 132 allows an alternating current for a dielectric strength voltage test to be applied from the hot line section located at the input side of the first relay 110 to the neutral line section located at the output side of the second relay 111. Of course, it is not necessary to apply a control signal, such as a relay drive signal or the like, to the second relay 111. Note that because the main power supply switch 103 is off, the first control circuit 105 cannot supply a relay drive signal. Therefore, the first and second relays 110 and 111 are both off.

Moreover, as shown in FIG. 6, the second X capacitor 134 is connected between one of the hot line sections of the hot line 108 that is located at the output side of the first relay 110 as viewed from the commercial alternating-current power supply 107, and one of the neutral line sections of the neutral line 109 that is located at the output side of the second relay 111 as viewed from the commercial alternating-current power supply 107. As shown in FIG. 7, the second X capacitor 134 allows an alternating current for a dielectric strength voltage test to be applied from the neutral line section located at the output side of the second relay 111 to the hot line section located at the output side of the first relay 110.

Figure 8:
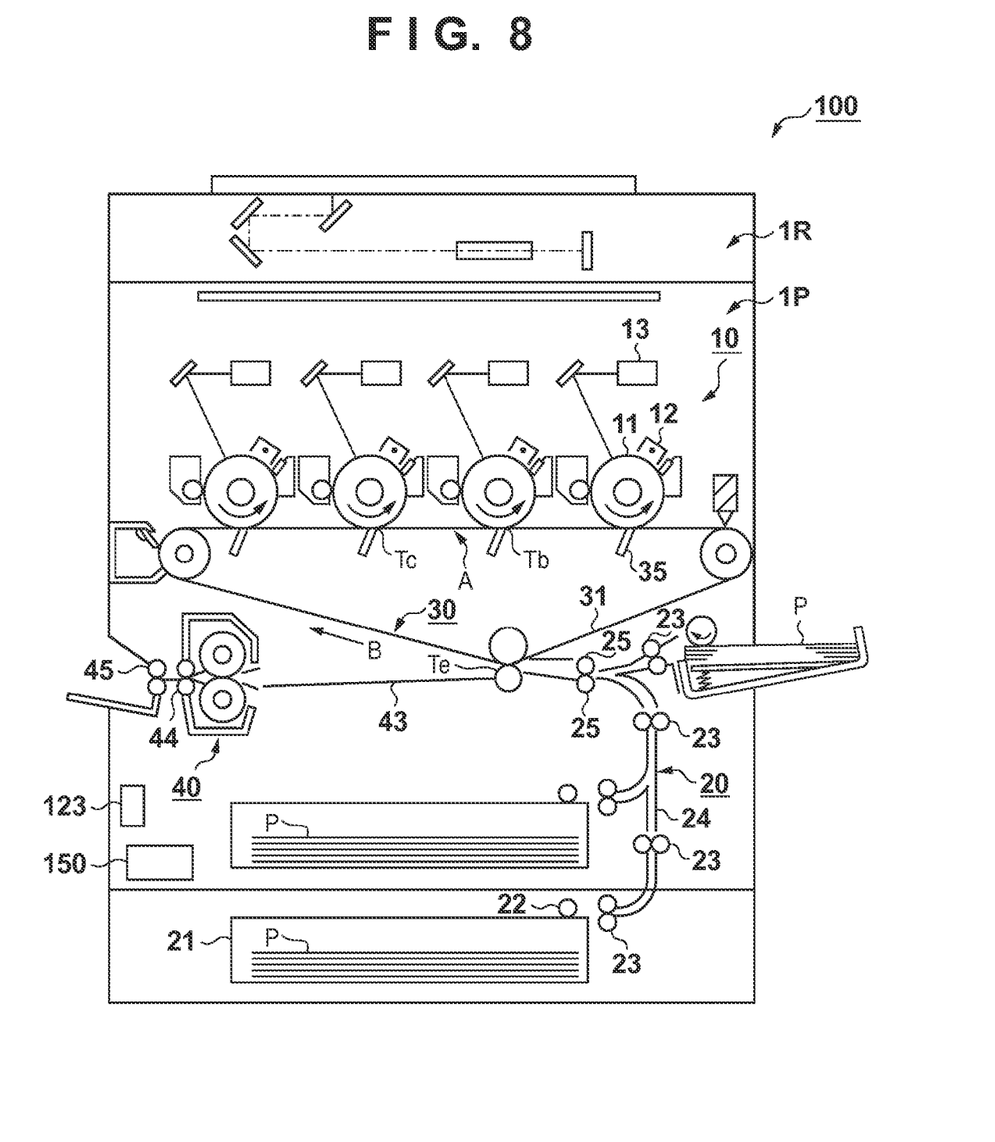
FIG. 8 is a cross-sectional view schematically showing an image formation device in the example.

FIG. 8 is a cross-sectional view schematically showing an image formation device that is an example electronics device. The image formation device 100 is a copier including an image reader 1R and an image output unit 1P. The image reader 1R optically reads an original image, converts the image into an electrical signal, and transmits the signal to the image output unit 1P. The image output unit 1P includes an image formation unit 10, a paper feed unit 20, an intermediate transfer unit 30, a fixation unit 40, a main controller 123, and a power supply device 150. Note that the image formation unit 10 includes a single station when it is a monochrome copier, and a plurality of stations when it is a color copier. FIG. 8 shows stations corresponding to four colors.

A photosensitive drum 11 of the image formation unit 10 is a drum-shaped electrophotographic photosensitive unit serving as a first image carrier, is supported for rotation about its axis, and is rotated and driven in a direction indicated by an arrow. The photosensitive drum 11 is rotated and driven using a brushless DC motor, such as the above motor 127 or the like. The image formation surface of the photosensitive drum 11 is uniformly electrically charged by a primary charger 12. A latent image is formed on the image formation surface by exposure performed by an optical system 13. The above high voltage power supply 128 applies a high charging voltage (e.g., 1 to 2 kV) to the primary charger 12. The latent image is developed to a toner image by a development device 14. The high voltage power supply 128 applies a high developing voltage (2 kV) to the development device 14. The toner image is transferred to an intermediate transfer belt 31 of the intermediate transfer unit 30 by a primary transfer unit 35 to which a high transferring voltage (1 to 2 kV) is applied by the high voltage power supply 128.

In the paper feed unit 20, a transfer material P stored in a cassette 21 is fed out by a pickup roller 22 sheet by sheet. The transfer material P is transported downstream along a paper feed guide 24 by a pair of paper feed rollers 23. The transfer material P is fed to a secondary transfer region Te by a pair of registration rollers 25 in synchronization with timing of image formation performed by the image formation unit 10. These rollers are driven by the motor 127. The high voltage power supply 128 applies a high secondary transfer voltage of 3 to 5 kV to the secondary transfer region Te. As a result, the toner image formed on the intermediate transfer belt 31 is transferred to the transfer material P. The transfer material P is transported to the fixation unit 40 by a transport belt 43. The fixation unit 40 heats and presses the transfer material P using a heating roller to fix the toner image on the transfer material P. The transfer material P with the fixed toner image is discharged by discharge rollers 44 and 45.

As described above, in this example, the first X capacitor 132 is connected between one of the hot line sections of the hot line 108 that is located at the output side of the first relay 110 as viewed from the commercial alternating-current power supply 107, and one of the neutral line sections of the neutral line 109 that is located at the input side of the second relay 111 as viewed from the commercial alternating-current power supply 107. The first X capacitor 132 allows an alternating current for a dielectric strength voltage test to be applied from the neutral line section located at the input side of the second relay 111 to the hot line section located at the output side of the first relay 110. Of course, it is not necessary to apply a control signal, such as a relay drive signal or the like, to the first relay 110. Moreover, the second X capacitor 134 is connected between one of the hot line sections of the hot line 108 that is located at the output side of the first relay 110 as viewed from the commercial alternating-current power supply 107, and one of the neutral line sections of the neutral line 109 that is located at the output side of the second relay 111 as viewed from the commercial alternating-current power supply 107. The second X capacitor 134 allows an alternating current for a dielectric strength voltage test to be applied from the hot line section located at the output side of the first relay 110 to the neutral line section located at the output side of the second relay 111. With this configuration, in this example, on an electronics device in which a switch element (e.g., a relay, a FET, etc.) that requires supply of a control signal for operation is provided on a power supply line, a dielectric strength voltage test can be performed in the absence of supply of the control signal to the switch element. In this example, employed are the first and second electric elements that apply an alternating current for a dielectric strength voltage test to a power line that is interrupted by a switch element, such as the first relay 110, the second relay 111 or the like. The first and second electric elements may be an inductor, a resistor or the like instead of a capacitor. In other words, an electric element capable of passing an alternating current may be employed. Note that these electric elements may be an element dedicated to applying an alternating current for a dielectric strength voltage test, or alternately, may be an element that can additionally serve as a circuit element that provides other functions, such as a part of a filter circuit or the like. If the electric elements also serve as another circuit element, the manufacturing cost can be reduced. The arrangement of the electric elements is not limited to the examples of FIGS. 4 to 7, and the electric elements may be only required to be arranged to connect a portion that is interrupted by the switch element and a portion that is not interrupted by the switch element. Although a relay is herein employed as the switch element, a field effect transistor (FET) or the like may be employed.

Figure 9:
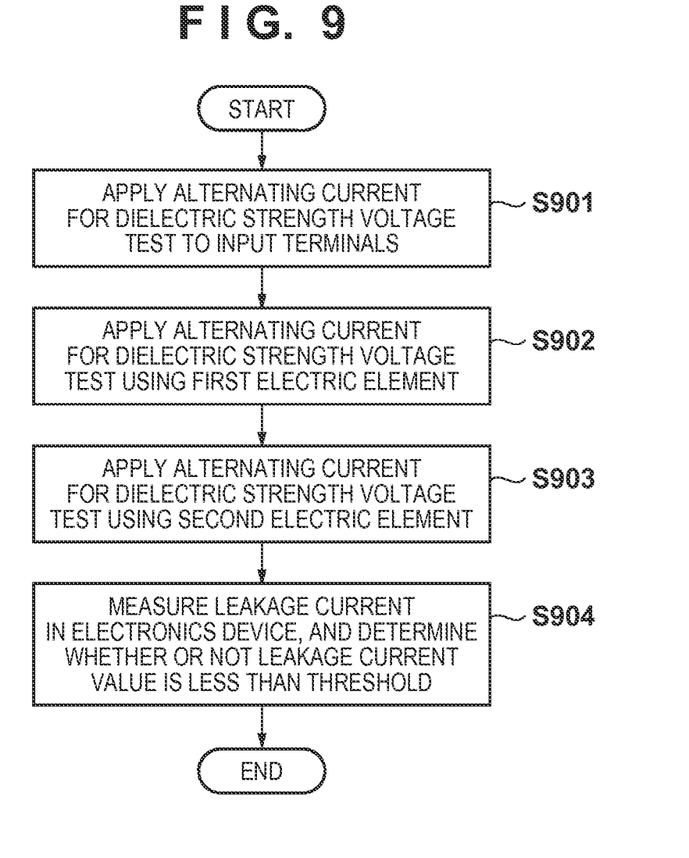
FIG. 9 is a flowchart showing a dielectric strength voltage test in the example.

A dielectric strength voltage testing method for an electronics device may include steps shown in FIG. 9. In S901, the test power supply 201 applies an alternating current for a dielectric strength voltage test to the input end (input terminal) of the hot line and the input end of the neutral line. In S902, the first electric element applies the alternating current for a dielectric strength voltage test from the neutral line located at the input side of the second switch element to the hot line located at the output side of the first switch element. In S903, the second electric element applies the alternating current for a dielectric strength voltage test from the hot line located at the output side of the first switch element to the neutral line located at the output side of the second switch element. In S904, a leakage current of the electronics device is measured using a measuring device (not shown), and it is determined whether or not the resulting value is less than a threshold. Note that the leakage current measuring device may be one that is commonly used in a dielectric strength voltage test.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-072341, filed Mar. 27, 2012 which is hereby incorporated by reference herein in its entirety.

What is claimed is:

1. An electronics device comprising:
a hot line and a neutral line forming a pair of power supply lines connected to a commercial alternating-current power supply;
a first switch element configured to switch on and off the hot line;
a second switch element configured to switch on and off the neutral line;
a common mode inductor switchably connectable to the hot line and to the neutral line;
a first capacitor connected between one of a plurality of hot line sections of the hot line and one of a plurality of neutral line sections of the neutral line, and configured to apply an alternating current for a dielectric strength voltage test from the neutral line section located at the input side of the second switch element to the hot line section located at the output side of the first switch element, even in a state where the first switch element is switched off, wherein the one of the plurality of hot line sections is located at an output side of the first switch element as viewed from the commercial alternating-current power supply, and the one of the plurality of neutral line sections is located at an input side of the second switch element as viewed from the commercial alternating-current power supply; and
a second capacitor connected between one of the plurality of hot line sections located at the output side of the first switch element as viewed from the commercial alternating-current power supply, and one of the plurality of neutral line sections located at an output side of the second switch element as viewed from the commercial alternating-current power supply, and configured to apply the alternating current for the dielectric strength voltage test from the hot line section located at the output side of the first switch element to the neutral line section located at the output side of the second switch element, even in a state where the second switch element is switched off;
wherein the first and second capacitors and the common mode inductor are each a part of a filter configured to filter line noise from the commercial alternating-current power supply.

2. The electronics device according to claim 1, wherein when the dielectric strength voltage test is performed, an input terminal of the hot line and an input terminal of the neutral line are shorted.

3. The electronics device according to claim 2, wherein when the dielectric strength voltage test is performed, the first and second switch elements are both off.

4. An electronics device comprising:
a hot line and a neutral line forming a pair of power supply lines connected to a commercial alternating-current power supply;
a first switch element configured to switch on and off the hot line;
a second switch element configured to switch on and off the neutral line;
a common mode inductor switchably connectable to the hot line and to the neutral line;
a first capacitor connected between one of a plurality of hot line sections of the hot line, the one of the plurality of hot line sections being located at an input side of the first switch element as viewed from the commercial alternating-current power supply, and one of a plurality of neutral line sections of the neutral line, the one of the plurality of neutral line sections being located at an output side of the second switch element as viewed from the commercial alternating-current power supply, and configured to apply an alternating current for a dielectric strength voltage test from the neutral line section located at the output side of the second switch element to the hot line section located at the input side of the first switch element, even in a state where the first switch element is switched off; and
a second capacitor connected between one of the plurality of hot line sections located at the output side of the first switch element as viewed from the commercial alternating-current power supply, and one of the plurality of neutral line sections located at an output side of the second switch element as viewed from the commercial alternating-current power supply, and configured to apply the alternating current for the dielectric strength voltage test from the hot line section located at the output side of the first switch element to the neutral line section located at the output side of the second switch element, even in a state where the second switch element is switched off;
wherein the first and second capacitors and the common mode inductor are each a part of a filter configured to filter line noise from the commercial alternating-current power supply.

5. The electronics device according to claim 4, wherein when the dielectric strength voltage test is performed, an input terminal of the hot line and an input terminal of the neutral line are shorted.

6. The electronics device according to claim 5, wherein when the dielectric strength voltage test is performed, the first and second switch elements are both off.

7. A method for performing a dielectric strength voltage test on an electronics device, wherein
the electronics device includes
a hot line and a neutral line forming a pair of power supply lines connected to a commercial alternating-current power supply;
a first switch element configured to switch on and off the hot line,
a second switch element configured to switch on and off the neutral line,
a common mode inductor switchably connectable to the hot line and to the neutral line;
a first capacitor connected between one of a plurality of hot line sections of the hot line, the one of the plurality of hot line sections being located at an output side of the first switch element as viewed from the commercial alternating-current power supply, and one of a plurality of neutral line sections of the neutral line, the one of the plurality of neutral line sections being located at an input side of the second switch element as viewed from the commercial alternating-current power supply, and a second capacitor connected between one of the plurality of hot line sections located at the output side of the first switch element as viewed from the commercial alternating-current power supply, and one of the plurality of neutral line sections located at an output side of the second switch element as viewed from the commercial alternating-current power supply, and the method comprises the steps of:

applying an alternating current for the dielectric strength voltage test between an input terminal of the hot line and an input terminal of the neutral line;

applying the alternating current for the dielectric strength voltage test from the neutral line section located at the input side of the second switch element to the hot line section located at the output side of the first switch element, using the first capacitor even in a state where the first switch element is switched off; and applying the alternating current for the dielectric strength voltage test from the hot line section located at the output side of the first switch element to the neutral line section located at the output side of the second switch element, using the second capacitor even in a state where the second switch element is switched off;

wherein the first and second capacitors and the common mode inductor are each a part of a filter configured to filter line noise from the commercial alternating-current power supply.

8. The method according to claim 7, further comprising turning off the first and second switch elements when the alternating current for the dielectric strength voltage test is applied.

9. A method for performing a dielectric strength voltage test on an electronics device, wherein the electronics device includes a hot line and a neutral line forming a pair of power supply lines connected to a commercial alternating-current power supply;

a first switch element configured to switch on and off the hot line, a second switch element configured to switch on and off the neutral line, a common mode inductor switchably connectable to the hot line and to the neutral line;

a first capacitor connected between one of a plurality of hot line sections of the hot line, the one of the plurality of hot line sections being located at an input side of the first switch element as viewed from the commercial alternating-current power supply, and one of a plurality of neutral line sections of the neutral line, the one of the plurality of neutral line sections being located at an output side of the second switch element as viewed from the commercial alternating-current power supply, and a second capacitor connected between one of the plurality of hot line sections located at the output side of the first switch element as viewed from the commercial alternating-current power supply, and one of the plurality of neutral line sections located at an output side of the second switch element as viewed from the commercial alternating-current power supply, and the method comprises the steps of:

applying an alternating current for the dielectric strength voltage test between an input terminal of the hot line and an input terminal of the neutral line;

applying the alternating current for the dielectric strength voltage test from the neutral line section located at the output side of the second switch element to the hot line section located at the input side of the first switch element, using the first capacitor even in a state where the first switch element is switched off; and applying the alternating current for the dielectric strength voltage test from the hot line section located at the output side of the first switch element to the neutral line section located at the output side of the second switch element, using the second capacitor even in a state where the second switch element is switched off;

wherein the first and second capacitors and the common mode inductor are each a part of a filter configured to filter line noise from the commercial alternating-current power supply.

10. The method according to claim 9, further comprising turning off the first and second switch elements when the alternating current for the dielectric strength voltage test is applied.

11. An electronics device comprising:

a hot line and a neutral line forming a pair of power supply lines connected to a commercial alternating-current power supply;

a first switch element configured to switch on and off the hot line;

a second switch element configured to switch on and off the neutral line;

a first capacitor connected between one of a plurality of hot line sections of the hot line and one of a plurality of neutral line sections of the neutral line, and configured to apply an alternating current for a dielectric strength voltage test from the neutral line section located at an input side of the second switch element to the hot line section located at an output side of the first switch element, even in a state where the first switch element is switched off, wherein the one of the plurality of hot line sections is located at an output side of the first switch element as viewed from the commercial alternating-current power supply, the one of the plurality of neutral line sections is located at an input side of the second switch element as viewed from the commercial alternating-current power supply; and a second capacitor connected between one of the plurality of hot line sections located at the output side of the first switch element as viewed from the commercial alternating-current power supply, and one of the plurality of neutral line sections located at an output side of the second switch element as viewed from the commercial alternating-current power supply, and configured to apply the alternating current for the dielectric strength voltage test from the hot line section located at the output side of the first switch element to the neutral line section located at the output side of the second switch element, even in a state where the second switch element is switched off;

wherein the first and second capacitors are each a part of a filter configured to filter line noise from the commercial alternating-current power supply.

12. An electronics device comprising:

a hot line and a neutral line forming a pair of power supply lines connected to a commercial alternating-current power supply;

a first switch element configured to switch on and off the hot line;

a second switch element configured to switch on and off the neutral line;

a first capacitor connected between one of a plurality of hot line sections of the hot line and one of a plurality of neutral line sections of the neutral line, and configured to apply an alternating current for a dielectric strength voltage test from the neutral line section located at an output side of the second switch element to the hot line section located at an input side of the first switch element, even in a state where the first switch element is switched off, wherein the one of the plurality of hot line sections is located at an input side of the first switch element as viewed from the commercial alternating-current power supply, the one of the plurality of neutral line sections is located at an output side of the second switch element as viewed from the commercial alternating-current power supply; and a second capacitor connected between one of the plurality of hot line sections located at the output side of the first switch element as viewed from the commercial alternating-current power supply, and one of the plurality of neutral line sections located at an output side of the second switch element as viewed from the commercial alternating-current power supply, and configured to apply the alternating current for the dielectric strength voltage test from the hot line section located at the output side of the first switch element to the neutral line section located at the output side of the second switch element, even in a state where the second switch element is switched off;

wherein the first and second capacitors are each a part of a filter configured to filter line noise from the commercial alternating-current power supply.

* * * * *